United States Patent
Liwinski

(10) Patent No.: US 6,515,546 B2
(45) Date of Patent: Feb. 4, 2003

(54) BIAS CIRCUIT FOR USE WITH LOW-VOLTAGE POWER SUPPLY

(75) Inventor: Henry Z. Liwinski, North Wales, PA (US)

(73) Assignee: Anadigics, Inc., Warren, NJ (US)

( * ) Notice: Subject to any disclaimer, the term of this patent is extended or adjusted under 35 U.S.C. 154(b) by 0 days.

(21) Appl. No.: 09/875,117

(22) Filed: Jun. 6, 2001

(65) Prior Publication Data

US 2002/0186084 A1 Dec. 12, 2002

(51) Int. Cl.[7] .............................. H03F 3/04; H03F 1/38
(52) U.S. Cl. ..................... 330/296; 330/288; 330/291
(58) Field of Search ................ 330/296, 288, 330/290, 291

(56) References Cited

U.S. PATENT DOCUMENTS

| | | | |
|---|---|---|---|
| 3,168,706 A | 2/1965 | Brenig | 330/18 |
| 3,491,203 A | 1/1970 | Shabad | 179/1 |
| 3,566,289 A | 2/1971 | Cope | 330/19 |
| 3,899,743 A | 8/1975 | Csicsatka | 330/22 |
| 4,117,417 A * | 9/1978 | Ahmed | |
| 4,119,924 A | 10/1978 | Ahmed | 330/288 |
| RE29,910 E * | 2/1979 | Ahmed | |
| 4,462,005 A | 7/1984 | Kusakabe | 387/750 |
| 4,475,077 A | 10/1984 | Nagano | 323/312 |
| 4,525,682 A | 6/1985 | Lai et al. | 330/288 |
| 4,654,602 A | 3/1987 | Aoki | 330/257 |
| 4,857,864 A | 8/1989 | Tanaka et al. | 330/288 |
| 4,897,614 A | 1/1990 | Nishio | 330/257 |
| 4,990,864 A | 2/1991 | Kwan | 330/288 |
| 5,079,518 A | 1/1992 | Wakayama | 330/288 |
| 5,283,537 A | 2/1994 | Nakamura | 330/288 |
| 5,307,023 A * | 4/1994 | Schade, Jr. | |
| 5,398,004 A | 3/1995 | Kobayashi | 330/293 |
| 5,404,585 A | 4/1995 | Vimpari et al. | 455/115 |
| 5,444,361 A | 8/1995 | Ryat | 323/312 |
| 5,451,908 A | 9/1995 | Böhme | 330/300 |
| 5,548,248 A * | 8/1996 | Wang | |
| 5,986,507 A | 11/1999 | Itakura et al. | 330/288 |
| 6,048,714 A | 3/2000 | Yamamoto et al. | 330/296 |
| 6,052,032 A | 4/2000 | Järvinen | 330/289 |
| 6,333,677 B1 * | 12/2001 | Dening | |

OTHER PUBLICATIONS

Yamamoto, et al., "A 3.2–V Operation Single–Chip Dual–Band AlGaAs/GaAs HBT MMIC Power Amplifier with Active Feedback Circuit Technique" in IEEE Journal of Solid–State Circuits, Aug. 2000, pp. 1109–1120.

* cited by examiner

Primary Examiner—Patricia T. Nguyen
(74) Attorney, Agent, or Firm—Pennie & Edmonds LLP

(57) ABSTRACT

A transistor bias circuit is provided that is capable of operating from a power supply voltage that is slightly higher than twice the base-emitter voltage of the transistor to be biased. The bias circuit includes a transistor connected in a current-mirror configuration with the transistor to be biased. A feedback circuit maintains die mirrored current at a constant level. The gain of the feedback circuit is improved by the addition of a non-inverting amplifier within the feedback circuit.

12 Claims, 2 Drawing Sheets

Modified Current Mirror Bias Circuit

Current Mirror Bias Circuit

Modified Current Mirror Bias Circuit

US 6,515,546 B2

BIAS CIRCUIT FOR USE WITH LOW-VOLTAGE POWER SUPPLY

FIELD OF THE INVENTION

The present invention relates generally to a circuit for biasing a transistor, and, more particularly, to a transistor bias circuit that is capable of operating from a power supply that produces a voltage that is only slightly higher than twice the base-emitter voltage of the transistor that is to be biased.

BACKGROUND OF THE INVENTION

Modern wireless communications devices, such as cellular telephones, are held to ever-higher performance standards. Transmissions must be clear and undistorted, and the battery in the devices must be small and have a long life. In order to meet these consumer requirements, wireless telephone designers have moved away from using traditional silicon-based bipolar transistors as power amplifiers and toward using more exotic transistors, such as heterojunction bipolar transistors ("HBTs") made of aluminum-gallium-arsenide/gallium-arsenide ("AlGaAs/GaAs") and indium-gallium-phosphide/gallium-arsenide ("InGaP/GaAs"). Such HBTs provide outstanding power efficiency and high linearity, thus enabling cellular phones to achieve longer battery life and better signal characteristics for voice and data.

Of course, an HBT, like a bipolar junction transistor ("BJT"), requires a direct-current current ("DC") bias signal (comprising both a voltage and a current) to be applied to its input terminal to establish its operating point. (The operating point of a transistor may be defined as the point on the transistor's characteristic curves at which the transistor will operate in the absence of an input signal. See, e.g., John Markus, Electronics Dictionary 445 (4th ed. 1979). Because changes in the DC bias signal affect the operating point of the HBT (and thus adversely affect the linearity of the amplifier), the DC bias signal must be very stable (preferably within 5% to 15%) and unaffected by variations in temperature or in the power supply voltage. Such a DC bias signal is normally generated by a "bias circuit."

A known bias circuit is shown in FIG. 1. Transistor Q2 is a transistor that is to be biased. The circuit comprises: transistor Q1, which is preferably matched to transistor Q2 and is connected to transistor Q2 in a current-mirror configuration; reference resistor R1; feedback transistor Q3; base resistors R2 and R3, which control the amount of bias current supplied to transistors Q1 and Q2; and pull-down resistor R4.

In this circuit, resistor R1 establishes a reference current $I_{CM}$ (for example, 1 milliampere) that passes through transistor Q1. Because transistors Q1 and Q2 are connected in a current-mirror configuration, the reference current $I_{CM}$ is mirrored in the matching transistor Q2 as current $I_{RF}$. If transistors Q1 and Q2 are matched, the circuit will be relatively insensitive to fluctuations in temperature, since the temperature characteristics of transistors Q1 and Q2 will be substantially the same.

Feedback through transistor Q3 and resistor R2 stabilizes reference current $I_{CM}$ to compensate for fluctuations in reference voltage $V_{REG}$, in temperature, or in the parameters of the transistors. For example, if reference voltage $V_{REG}$ increases, the voltage at the base of transistor Q3, and subsequently the voltage at the emitter of transistor Q3, also increases. Consequently, the amount of current flowing into the base of mirrored transistor Q1 correspondingly increases. The collector-emitter voltage of transistor Q1 therefore decreases, pulling down the voltage at the collector of transistor Q1 to a value close to what it had been before reference voltage $V_{REG}$ increased.

Transistors Q2 and Q3 and resistors R1 and R2 thus form a negative feedback loop that provides a stable bias voltage at the emitter of transistor Q3 and an accordingly stable current through resistor R3 into the base of transistor Q2, the transistor to be biased. The effectiveness of the feedback is directly impacted by the amount of gain in the loop. Here, the total loop gain is close to the gain of transistor Q1 and is proportional to the size of resistor R1: the larger the size of resistor R1, the more gain there is in the loop and the smaller the loop error will be.

But a serious problem exists with the bias circuit of FIG. 1. Because transistors Q1 and Q3 are "stacked", the circuit operates well only from a power supply voltage that is substantially higher than twice the base-emitter voltage of the transistors. An example is the case where (1) the transistors in FIG. 1. are InGaP/GaAs or AlGaAs/GaAs HBTs (which require a base-emitter voltage ($V_{BE}$) of about 1.33 V in order to operate); and (2) the power supply voltage is about 3.0 V, which is two-and-a-quarter times the base-emitter voltage of the transistors. Because the emitters of transistors Q1 and Q2 in this circuit are connected to ground (0 V), the voltage at the base of transistor Q1 and the voltage at the base of transistor Q2 must be at least about 1.33 V in order for them to operate. Since the voltage drop across resistor R2 (and also across RF choke L1 and resistor R3) is neglible, the voltage at the emitter of transistor Q3 must therefore be likewise about 1.33 V.

Similarly, transistor Q3 must have a voltage difference of 1.33 V between its base and its emitter. That is, the base of transistor Q3 must be at a voltage potential that is 1.33 V higher than the voltage potential at its emitter. But since, as described above, the voltage at the emitter of transistor Q3 must be at least 1.33 V in order for transistors Q1 and Q2 to operate, the voltage at the base of transistor Q3 must be at least 2.66 V above ground potential (1.33 V at the emitter of transistor Q3 plus the 1.33 V emitter-base junction voltage of transistor Q3), for transistor Q3 to operate.

Furthermore, in order for the voltage at the base of transistor Q3 to be 2.66 V, the voltage drop across resistor R1 must be about 0.34 V (the supply voltage of 3.0 V minus the necessary voltage at the base of transistor Q3 of 2.66 V=0.34 V). If the desired current $I_{CM}$ is 1 mA, for example, then the resistance of resistor R1 would be about 340 ohms (R=V/I=0.34 V/1 mA=340 ohms).When resistor R1 is 340 ohms, the gain in the feedback loop formed by transistors Q1 and Q3 and resistors R1 and R2—which, as described above, is proportional to the size of resistor R1—is generally sufficient to provide an adequately stable bias voltage and current to transistor Q2.

The feedback in the bias circuit of FIG. 1 becomes quickly ineffective, however, if the power supply voltage is lowered from substantially higher than twice the base-emitter voltage of the transistors in the circuit to a value only slightly higher than two times their base-emitter voltage. An example of such a supply voltage is 2.7 V, where the transistors in the circuit are HBTs having $V_{BE}$=1.33 V. This supply voltage, 2.7 V, is the power supply voltage that is available in modem cellular telephones. In order for the circuit of FIG. 1 to function from a 2.7 V supply voltage, it becomes necessary to reduce the size of resistor R1. The resistance of resistor R1 for this case may be calculated as follows: the supply voltage of 2.7 V minus the necessary bias voltage of 2.66 V is 0.04 V. If current $I_{CM}$ is desired to be 1 mA, resistor R1 must be 40 ohms (R=0.04 V/1 mA=40 ohms).

Thus, the size of resistor R1 when the power supply voltage is 2.7 V (40 ohms) must be more than eight times smaller than the size of resistor R1 when the power supply voltage is 3.0 V (340 ohms). When resistor R1 is as small as 40 ohms, however, the gain in the feedback loop, which is proportional to the size of resistor R1, also is small, and, as a practical matter, is insufficient to compensate adequately for variations in temperature and power supply voltage. In other words, if the temperature or power supply voltage varies by even a small amount, the DC bias signal produced by the bias circuit will reflect the variation. The performance of the bias circuit of FIG. 1 thus is unacceptable if the supply voltage is 2.7 V.

This problem of biasing an HBT when the available power supply voltage is only 2.7 V is addressed in U.S. Pat. No. 6,043,714. The solution described in this patent is to substitute a bipolar junction transistor ("BJT") for one of cascaded transistors in the bias circuit. But circuits that include both HBTs and BJTs cannot be fabricated on a single integrated circuit, because a BJT requires a silicon substrate, while an InGaP/GaAs or AlGaAs/GaAs HBT requires a gallium-arsenide substrate.

Accordingly, a bias circuit for InGaP/GaAs or AlGaAs/GaAs HBTs is needed that is capable of operating from a supply voltage of as low as 2.7 V and that can be manufactured on a single integrated circuit.

OBJECT OF THE INVENTION

It is therefore an object of the invention to provide a transistor bias circuit that is (1) capable of operating from a power supply that produces a voltage that is only slightly greater than twice the base-emitter voltage of the transistor to be biased; (2) relatively insensitive to fluctuations in supply voltage, temperature, and transistor parameters; and (3) capable of being manufactured on the same integrated circuit as the transistor to be biased.

SUMMARY OF THE INVENTION

In accordance with the invention, a bias circuit is provided that is capable of operating with a power supply voltage that is just above twice the value of the base-emitter voltage of the transistors in the circuit. The bias circuit includes a first transistor connected in a current-mirror configuration with the transistor to be biased ("the biased transistor") and a feedback circuit. The voltage at the collector of the first transistor is fed back via the feedback circuit to control the voltage at the bases of the first transistor and the biased transistor.

The feedback circuit comprises a non-inverting amplifier connected at its input to the collector of the first transistor and at its output to a second transistor connected in an emitter-follower configuration. This second transistor is connected at its collector to the power supply and at its emitter to the node formed by the bases of the first transistor and the biased transistor. It thus establishes base currents entering the first transistor and the biased transistor. The collector-emitter current passing through the first transistor (which is mirrored in the biased transistor) is thereby maintained at a constant level via negative feedback.

The non-inverting amplifier may comprise two or more transistors in a cascade. The bias circuit stage additionally comprises several current-limiting resistive elements and one or more inductors that serve as RF chokes.

Also described herein is a method of biasing a first transistor having a base, emitter, and collector via a circuit including a second transistor connected in a current-mirror configuration with the first transistor. The method includes the steps of monitoring an electrical characteristic (current or voltage) at the collector of the second transistor, amplifying the monitored characteristic, and feeding back the amplified characteristic to control the second transistor. The step of amplifying may further include the steps of inverting the monitored characteristic and then re-inverting the characteristic, such that a non-inverted characteristic is produced. In addition, the method may comprise the step of level-shifting the monitored characteristic.

DETAILED DESCRIPTION OF THE INVENTION

Figure 1:
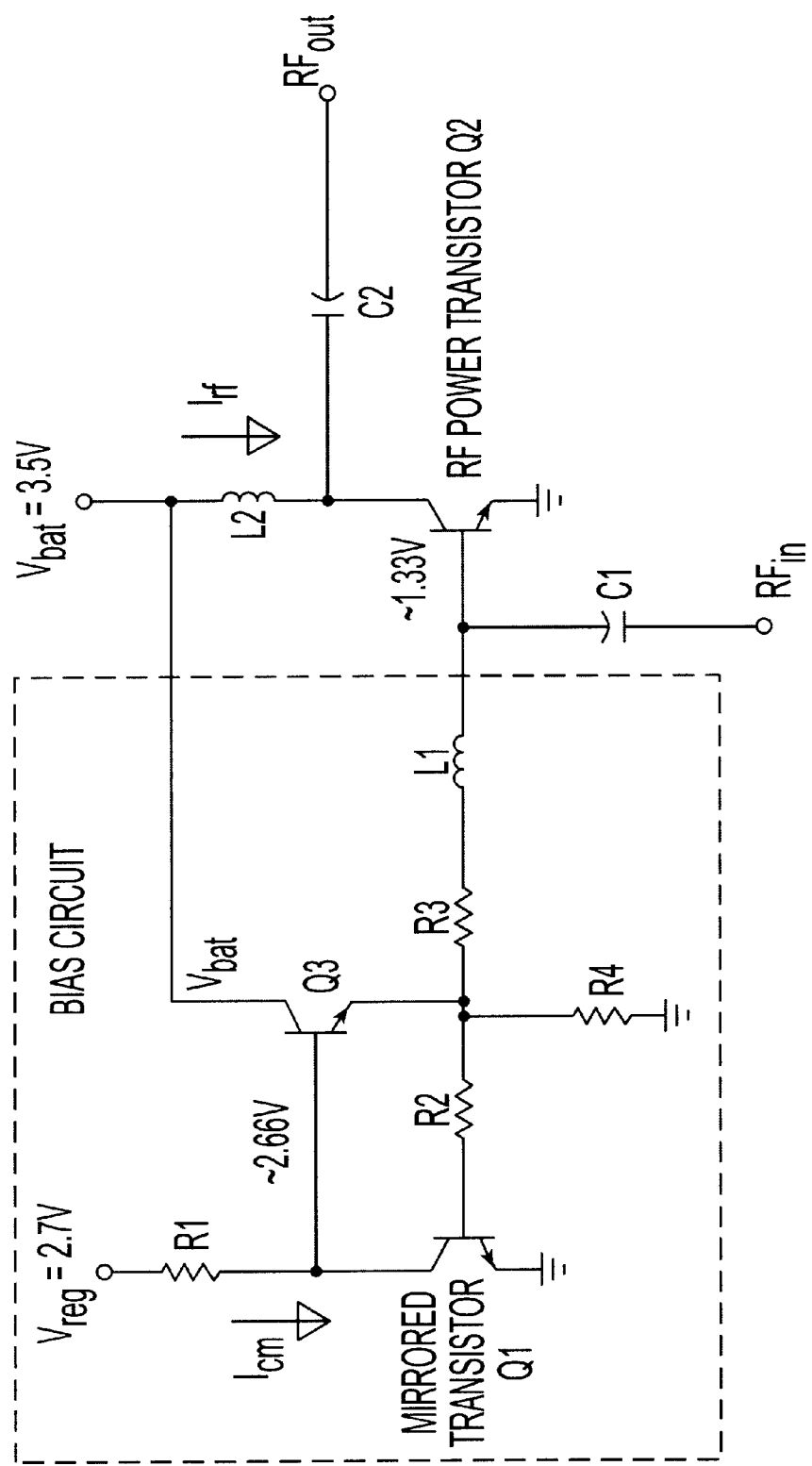
FIG. 1 shows a schematic circuit diagram illustrating a prior art bias circuit.
Figure 2:
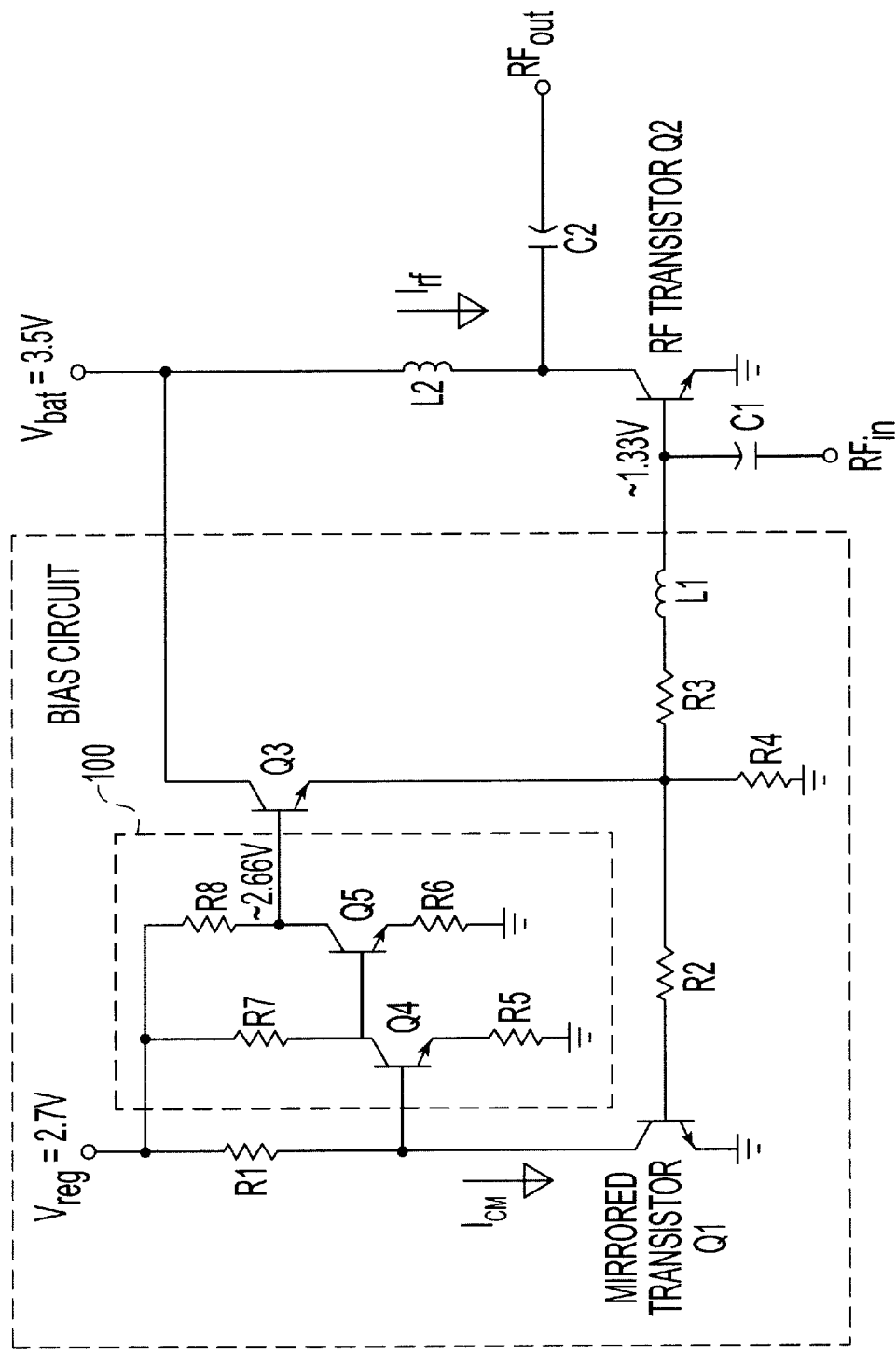
FIG. 2 shows a schematic circuit diagram of a bias circuit according to the present invention.

A bias circuit in accordance with an embodiment of the present invention is illustrated in FIG. 2. The circuit is similar to that described for FIG. 1 above, except that a non-inverting amplifier 100 has been added. Non-inverting amplifier 100 may comprise additional transistors Q4 and Q5 and resistors R5, R6, R7, and R8, the resistances of which are selected to provide appropriate quiescent operating points and transistor gains.

Non-inverting amplifier 100 serves two functions: (1) level-shifting the voltage at the collector of transistor Q1 (and the base of transistor Q4) to the required operating voltage of transistor Q3 and (2) amplifying fluctuations in the voltage at the collector of transistor Q1. Whereas in the circuit of FIG. 1 (without non-inverting amplifier 100), the voltage at the collector of transistor Q1 had to be about 2.66 V or more in order for transistors Q2 and Q3 to operate, in the circuit of FIG. 2 this voltage may be as low as about 1.5 V. Resistor R1 may therefore be large, which increases the feedback loop gain and reduces the sensitivity of the bias circuit to reference voltage fluctuations. The feedback loop gain is further increased by non-inverting amplifier 100. The bias circuit of the present invention is thus able to compensate for smaller fluctuations than the prior art circuit of FIG. 1.

The operation of the circuit in FIG. 2 is as follows. Resistor R1 establishes a reference current $I_{CM}$, passing through transistor Q1 and also a current $I_{B,Q4}$ passing into the base of transistor Q4. If reference voltage Vref increases, both the voltage at the base of transistor Q4 ($V_{B,Q4}$) and the current $I_{B,Q4}$ correspondingly increase. The collector-emitter current through transistor Q4 ($I_{CE,Q4}$) therefore increases, while the collector-emitter voltage of transistor Q4 ($V_{CE,Q4}$) decreases, pulling down the voltage at the base of transistor Q5 ($V_{B,Q5}$) and amplifying the fluctuation in voltage $V_{B,Q5}$. The decreased voltage $V_{B,Q5}$ causes the collector-emitter voltage of transistor Q5 to increase, thus pulling up the voltage $V_{B,Q3}$ at the base of transistor Q3. The collector-emitter voltage of transistor Q3 correspondingly decreases, thus pulling up the voltage at the emitter of transistor Q3. The current into the base of transistor Q1 in turn increases, causing the collector-emitter voltage of transistor Q1 to decrease and thereby pulling down the voltage at its collector back to the desired quiescent value.

Advantageously, by the addition of non-inverting amplifier 100, the gain in the feedback loop is made sufficient to compensate for variations in reference voltage $V_{REG}$, even when the power supply voltage is as low as 2.7 V, just slightly higher than twice the base-emitter voltage of the HBT transistors in the circuit.

As in the circuit of FIG. 1, inductors L1 and L2 serve as RF chokes. Inductor L1 prevents the RF input signal from affecting the bias circuit, and a power supply voltage is applied through inductor L2 to transistor Q2. Capacitors C1 and C2 are de-coupling capacitors that eliminate DC voltages in the input and output signals.

In summary, there has been disclosed a bias circuit that is capable of operating from a power supply that produces a voltage that is only slightly higher that twice the base-emitter voltage of the biased transistor. In addition, the disclosed bias circuit is relatively insensitive to fluctuations in temperature, as long as and to the extent that transistor Q1 has the same temperature characteristics as transistor Q2. This condition may be satisfied by manufacturing transistors Q1 and Q2 as matched transistors, which is well-known in the art. Finally, because transistors Q1, Q3, Q4, and Q5 may be of the same transistor type as the biased transistor Q2, the bias circuit and the biased transistor may be integrated on the same integrated circuit.

One skilled in the art will recognize that the bias circuit of the present invention will operate without inductor L1 and resistors R2, R3, R4, R5 and R6. Although these elements are optional, the stability of the circuit is enhanced by their presence. In addition, depending on the particular characteristics of the bias circuit and the power amplifier (including, for example, the type of transistor used, the gain in the bias circuit feedback loop, and the parameters of the non-inverting amplifier), it may also be necessary to increase the stability of the bias circuit by adding one or more phase-compensating R-C networks, which is a well-known technique in the design of RF amplifier circuits.

One skilled in the art will also recognize that although a preferred embodiment of the invention has been described as a bias circuit composed of HBTs, the invention is not limited to such transistors. An alternative embodiment of the invention may be readily constructed with, e.g., npn-type or pnp-type BJTs, other varieties of HBTs, or field-effect transistors ("FETs"). The invention is particularly suited for use whenever the supply voltage is only slightly higher than twice the base-emitter voltage (for bipolar transistors) or the gate-source voltage (for FETs) of the transistors used in the bias circuit.

Since the invention can be practiced using either bipolar and field-effect transistors, and since these two types of transistors have terminals that are generally known by different names, the following terms will be used herein to describe generically the terminals of the transistors used in the invention: (1) The term "control terminal"includes the gate of a FET and the base of a bipolar transistor; (2) the term "current-source terminal"includes the drain of a FET and the collector of a bipolar transistor; and (3) the term "current-sink terminal"includes the source of a FET and the emitter of a bipolar transistor.

It is further understood that the embodiments described herein are merely illustrative and are not intended to limit the scope of the invention. One skilled in the art may make various changes, rearrangements and modifications to the illustrative embodiments described above without substantially departing from the principles of the invention, which is limited only in accordance with the claims. Accordingly, all such deviations and departures should be interpreted to be within the spirit and scope of the following claims.

What is claimed is:

1. A circuit for biasing a first transistor having a control terminal, current-sink terminal, and current-source terminal and capable of operating from a power supply having positive and ground terminals, the circuit comprising:
   a. a second transistor having a control terminal, current-sink terminal and current-source terminal,
      i. wherein the control terminal of said second transistor is connected to the control terminal of such first transistor in a current-mirror configuration, and
      ii. wherein the current-sink terminal of said second transistor is connected to the ground terminal of such power supply;
   b. a first resistor connected between the current-source terminal of said second transistor and the positive terminal of such power supply;
   c. a feedback circuit, including
      i. a non-inverting amplifier having input and output ports,
         (1) wherein the input port of said non-inverting amplifier is connected to the node formed by said first resistor and the current-source terminal of said second transistor; and
      ii. a feedback transistor having a control terminal, current-sink terminal, and current-source terminal,
         (1) wherein the control terminal of said feedback transistor is connected to the output port of said non-inverting amplifier,
         (2) wherein the current-sink terminal of said feedback transistor is connected to the node formed by the connection of said second transistor to such first transistor, and
         (3) wherein the current-source terminal of said feedback transistor is connected to the positive terminal of such power supply,
   whereby said non-inverting amplifier increases the gain of the feedback circuit so that the bias circuit is relatively insensitive to fluctuations in supply voltage or temperature.

2. The circuit according to claim 1, wherein said second transistor is one of a BJT, an HBT, and a FET.

3. The circuit according to claim 1, wherein said feedback transistor is one of a BJT, an HBT, and a FET.

4. The circuit according to claim 1, further comprising a second resistor coupled between the current-sink terminal of said feedback transistor and the ground terminal of such power supply.

5. The circuit according to claim 1, further comprising:
   a. a third resistor coupled between the control terminal of such first transistor and the current-sink terminal of said feedback transistor; and
   b. a fourth resistor coupled between the control terminal of said second transistor and the current-sink terminal of said feedback transistor.

6. The circuit according to claim 1 wherein said non-inverting amplifier comprises two cascaded transistors, each having a control terminal, current-sink terminal, and current-source terminal.

7. The circuit according to claim 6, wherein said non-inverting amplifier further comprises:
   a. two resistors, each coupled between the current-source terminal of one of said cascaded transistors, respectively, and the positive terminal of such power supply.

8. The circuit according to claim 7, wherein said non-inverting amplifier further comprises:

a. two resistors, each coupled between the current-sink terminal of one of said cascaded transistors, respectively, and the ground terminal of such power supply.

9. A method of biasing a first transistor having a control terminal, a current-sink terminal, and a current-source terminal and capable of operating from a power supply having positive and ground terminals via a bias circuit including a second transistor connected in a current-mirror configuration with the first transistor, the method comprising the steps of:

a. monitoring an electrical characteristic at the current-source terminal of the second transistor;

b. amplifying the monitored characteristic; and c. feeding back the amplified characteristic to control the second transistor.

10. The method of claim 9, wherein the electrical characteristic is one of current and voltage.

11. The method of claim 9, wherein the step of amplifying comprises the steps of inverting the characteristic and then re-inverting the characteristic, such that a non-inverted amplified characteristic is produced.

12. The method of claim 9, further comprising the step of level-shifting the monitored characteristic.

* * * * *